United States Patent
Degani et al.

(10) Patent No.: US 6,437,990 B1
(45) Date of Patent: Aug. 20, 2002

(54) MULTI-CHIP BALL GRID ARRAY IC PACKAGES

(75) Inventors: Yinon Degani, Highland Park; Thomas Dixon Dudderar, Chatham; King Lien Tai, Berkeley Heights, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/528,882

(22) Filed: Mar. 20, 2000

(51) Int. Cl.$^7$ ................................. H05K 7/06
(52) U.S. Cl. .................. 361/783; 361/760; 361/767; 361/768; 361/770; 257/723; 257/778
(58) Field of Search ................ 361/760, 767, 361/768, 770, 771, 783, 803, 804; 257/686, 723, 724, 777, 778

(56) References Cited

U.S. PATENT DOCUMENTS

| | | | |
|---|---|---|---|
| 4,616,655 A | * 10/1986 | Weinberg et al. | 361/734 |
| 5,391,917 A | * 2/1995 | Gilmour et al. | 257/724 |
| 5,477,082 A | * 12/1995 | Buckley, III et al. | 257/778 |
| 5,798,567 A | * 8/1998 | Kelly et al. | 257/723 |
| 6,137,164 A | * 10/2000 | Yew et al. | 257/778 |
| 6,166,443 A | * 12/2000 | Inaba et al. | 257/778 |
| 6,201,266 B1 | * 3/2001 | Ohuchi et al. | 257/778 |
| 6,201,302 B1 | * 3/2001 | Tzu | 257/724 |
| 6,229,215 B1 | * 5/2001 | Egawa | 257/778 |
| 6,239,484 B1 | * 5/2001 | Dore et al. | 257/777 |

* cited by examiner

*Primary Examiner*—David L. Talbott
*Assistant Examiner*—John B. Vigushin
(74) *Attorney, Agent, or Firm*—Peter V. D. Wilde; Thomas, Kayden, Horstemeyer & Risley LLP

(57) ABSTRACT

The specification describes a high density IC BGA package in which one or more IC chips are wire bonded to a BGA substrate in a conventional fashion and the BGA substrate is solder ball bonded to a printed wiring board. The standoff between the BGA substrate and the printed wiring board to which it is attached provides a BGA gap which, according to the invention, accommodates one or more IC chips flip-chip bonded to the underside of the BGA substrate. The recognition that state of the art IC chips, especially chips that are thinned, can easily fit into the BGA gap makes practical this efficient use of the BGA gap. The approach of the invention also marries wire bond technology with high packing density flip-chip assembly to produce a low cost, high reliability, state of the art IC package.

7 Claims, 2 Drawing Sheets

MULTI-CHIP BALL GRID ARRAY IC PACKAGES

FIELD OF THE INVENTION

This invention relates to ball grid array (BGA) integrated circuit (IC) packages with multiple chips for high interconnect density.

BACKGROUND OF THE INVENTION

Multi-chip IC packages are becoming more widely in the IC industry because of increased device packing density, which translates into smaller packages with reduced cost. Typical multi-chip packages have multiple chips or multi-chip modules carried by a printed wiring board. In an effort to increase device packing density, IC packages have been proposed and used with multiple chips mounted on both sides of a printed wiring board. This approach complicates the interconnection strategy in the overall assembly, but reduces by nearly one-half the footprint of the IC package.

State of the art multiple chip IC packages are typically interconnected using flip-chip solder bump technology. In increasing numbers of applications flip-chip technology has replaced wire bonding interconnect technology which has been in widespread use since the earliest days of IC packaging. However, wire bonding has advantages that remain attractive. Wire bonding techniques and wire bonding machines have been refined to the point where wire bonds are relatively inexpensive and are highly reliable. However, wire bonds are regarded as having limited use in more advanced packaging approaches, partly because wire bonds require greater pitch than is available in many state of the art packages. Thus for small pitch interconnection applications the trend in the technology has been toward solder bump interconnection approaches. However, due largely to high I/O density, packaging yield using advanced packaging techniques may suffer, and the complexity of the packaging process is increased. As a result the overall cost per bond may be relatively high. The low cost and high reliability of wire bonds makes them attractive if ways can be found to adapt wire bonding to packaging high density I/O chips.

STATEMENT OF THE INVENTION

We have developed a multiple chip ball grid array package in which the I/O density is increased by mounting active chips in the standoff space (referred to herein as the BGA gap) on the underside of the substrate inside the ball grid array (BGA). This space, usually empty, or used for power and ground through connections, is efficiently utilized for chip sites to increase the I/O packing density of the package. In the preferred embodiment, one or more logic chips are wire bonded to the top side of the BGA substrate and two or more memory chips are placed in the BGA gap on the bottom side. The term "chips" in this context means either single bare die configured for flip-chip interconnect or a cluster of more than one such die that has been sawn from a wafer processed for flip-chip interconnect in a multiple IC array or a chip-scale package (CSP). Interconnections between the logic and memory chips are made using vias through the BGA substrate. If desired, efficient heat sinking of the IC chips in the BGA gap can be realized by attaching the backside of the chips to the substrate during reflow of the BGA. Heat sinking of the chip or chips on the top side of the BGA can be effected by providing a heat sink plate as a cover. The chips on the underside are typically thinned to fit into the conventional standoff for the BGA. To accommodate thicker chips, the substrate board can be shaped to provide a cavity for partially recessing the chip into the substrate.

The arrangement of the invention allows the large number of I/O interconnections for the logic chip to fan out on the BGA substrate to perimeter sites that are wire bonded to controller chip. These perimeter sites on the top of the substrate are then interconnected using vias to the chips on the underside of the substrate. This hybrid approach marries, in a simple and efficient way, the low cost and high reliability of wire bonds with the high I/O density of flip-chip technology.

DETAILED DESCRIPTION

Figure 1:
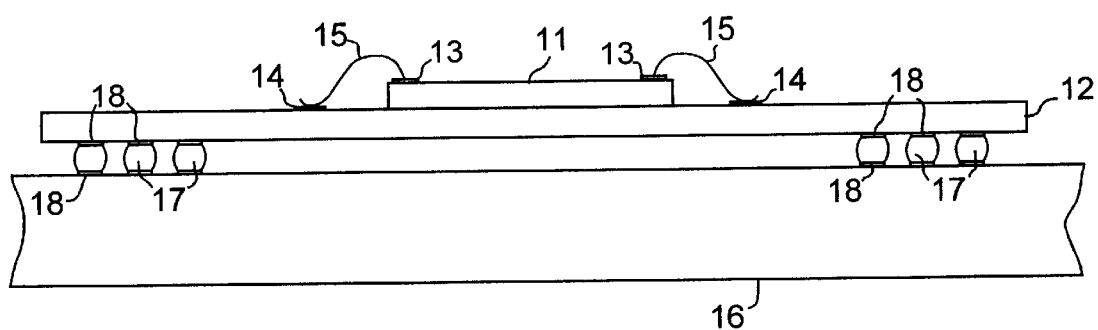
FIG. 1 is a schematic representation of a conventional BGA package.

A conventional BGA package is shown in FIG. 1. IC chip 11 is die bonded to interconnect substrate 12. The interconnect substrate is typically a circuited laminate made of standard epoxy or other suitable material. Bond pads 13 on the IC chip are interconnected to bond pads 14 on the interconnect substrate by wire bonds 15. The substrate 12 is interconnected to the next board level, typically a motherboard 16, by the array of solder balls 17. The solder balls are usually attached to BGA bond pads 18. FIG. 1 shows a single chip mounted on substrate 12, but as understood in the art, there may be several or many such chips mounted in similar fashion. The wire bonds in this view suggest a single row of in-line wires, but multiple rows of wire bonds, in-line or staggered, are commonly used. This package design, with wire bonds to the IC chip, and large ball bonds to the next interconnect level, is robust and inexpensive. However, as recognized by those skilled in the art, the chip density, and the density of I/O interconnections, in this package is modest.

Figure 2:
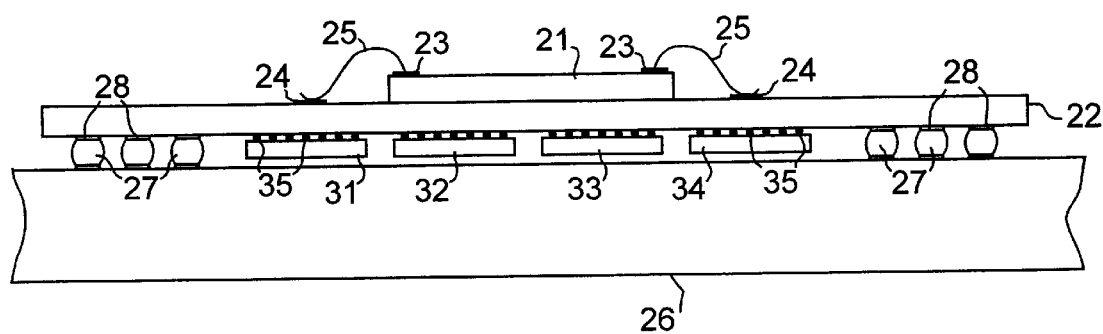
FIG. 2 is a schematic representation of one embodiment of the doublesided hybrid BGA package of the invention.

We have recognized that state of the art IC chips can be made thin enough that they can be mounted in the space between the board 16 and the substrate 12. For convenience in this description this space will be referred to herein as the "BGA gap". A BGA package designed according to the invention is shown in FIG. 2, where the IC chip is designated 21 and is die bonded to interconnect substrate 22 as in FIG. 1. Bond pads 23 on the IC chip are interconnected to bond pads 24 on the interconnect substrate by wire bonds 25. The substrate 22 is interconnected to motherboard 26, by solder balls 27 and BGA bond pads 28. Attached to the underside of the substrate 22, in the BGA gap, is an array of IC chips 31–34. Each of the array of IC chips is flip-chip bonded to the underside of substrate 22 using solder bumps 35. Solder bumps 35 are typically provided with under bump metallization (not shown). Substrate 22 therefore supports a hybrid of wire bonded chips and solder bonded flip-chips.

In the preferred embodiment of the invention the wire bonded IC chip 21 is a logic/controller IC chip and the IC chips 31–34 in the array on the underside of substrate 22 are memory IC chips. As shown, the standoff between motherboard 26 and substrate 22, i.e. the BGA gap thickness, is sufficient to accommodate the thickness of the IC chips 31–34. In a typical BGA package, this standoff distance is approximately 15–25 mils. The usual wafer thickness for IC devices is 26–30 mils. Thus it is recommended that the wafers be thinned prior to dicing to reduce the IC chip thickness to below the BGA standoff dimension. The thinning step is conventional, and in state of the art IC technology is performed routinely. IC chips are typically thinned to 10–15 mils. It is this state of the art, and new recognition of the package implications of it, that leads to the practical implementation of the invention without significantly adding to the processing and expense of wafer fabrication.

The arrangement described above and shown in FIG. 2, i.e. with one or more IC chips wire bonded to the top surface of the substrate and one or more IC chips flip-chip bonded in the BGA gap, represents a preferred package design according to the invention. However, in principle IC chips can be thinned to even smaller dimensions, and with the current development of fine wire bond techniques with relatively flat profiles, one or more wire bonded IC chips may be mounted in the BGA gap. Another very practical alternative is to flip-chip bond the IC chips on the top of the substrate. So the permutations of package designs in addition to the preferred choice are:

1. Flip-chip bonded or surface mount chip(s) on the top of the substrate with flip-chip bonded chip(s) in the BGA gap.
2. Wire bonded chip(s) on the top of the substrate with wire bonded chip(s) in the BGA gap.
3. Wire bonded chip(s) in the BGA gap with flip-chip or surface mount chip(s) on the top of the substrate.

In each case the mounting of one or more IC chips in the BGA gap meets the main criterion of the invention.

Figure 3:
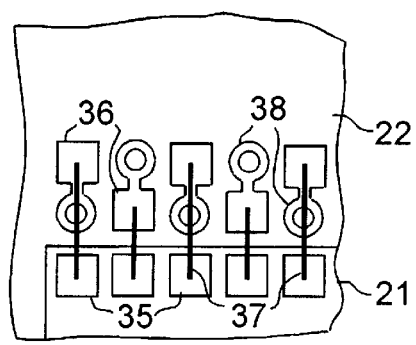
FIG. 3 is a plan view of a portion of the substrate of FIG. 2.

An important feature of the hybrid BGA package of the invention is the provision of through hole interconnections, or vias, between wire bonded logic/controller chip 21 on the top of substrate 22 and memory chips 31–34 on the underside. For clarity, the vias are not shown in FIG. 2, but are illustrated in FIG. 3. In FIG. 3, a portion of IC chip 21 is shown, as well as a portion of substrate 22 on which it is mounted. IC chip 21 may be die bonded or otherwise affixed to substrate 22. An array of wire bond pads 35 is shown along the edge of IC chip 21. A corresponding array of wire bond pads 36 are formed on substrate 22. Wire bond interconnections are shown at 37. In this figure the wire bond pads on substrate 22 are shown in two rows to illustrate the several alternative arrangements that may be used for the wire bond sites. The pads on IC chip 21 can also be arranged in more than one row, and staggered and overlapped so that, e.g., 200 pads, each having a 50 $\mu$m square, can be accommodated along a chip side of substantially less than 10,000 $\mu$m.

Associated with the bond pad sites 36 are vias 38 that interconnect the wire bond pads 36 to the underside of substrate 22. While not shown, it will be understood by those skilled in the art that printed circuits are provided on substrate 22. The printed circuits interconnect IC chips 31–34, IC chip 21, and BGA balls 27. It will also be understood that a wide variety of interconnection circuits may be used for the invention. These circuits may interconnect some of the wire bond pads 36 together, in which case each wire bond pad will not require an associated via. The vias are shown as situated along the edge of IC chip 21 but may alternatively occupy any of the substrate area on the top side of substrate 22. Likewise the printed circuits on the upper and lower sides of substrate 22 may extend over the entire available surface. This large surface area adds significantly to the design flexibility of the interconnection patterns. It is also practical to add interconnection circuits to substrate 26. Moreover, it should be understood that either or both of substrate 22 motherboard 26 can be multilevel printed circuit boards.

For a robust IC package, the cavity occupied by IC chips 31–34 may be underfilled with an epoxy if desired, and the IC chip 21 overmolded with plastic, or otherwise enclosed as required by the application.

Figure 4:
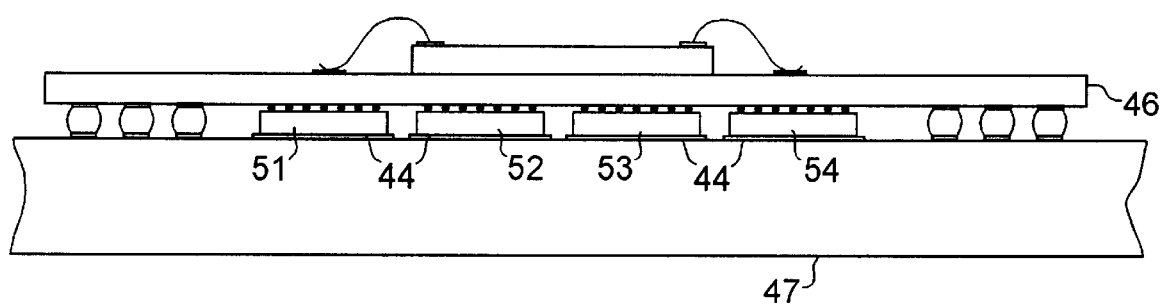
FIG. 4 is a schematic representation of a second embodiment of the double-sided hybrid BGA package of the invention.

In the arrangement of FIG. 2, the space between substrate 22 and printed circuit board 26 is sufficient to accommodate IC chips 31–34 with clearance between the IC chips and board 26. FIG. 4 shows an alternative arrangement where the IC chips contact the printed circuit board. For this approach, the backsides of the IC chips are furnished with an appropriate solder wettable metallization, and solder pads 44 are provided on printed wiring board 47 as shown. Assembly to printed wiring board 47 is accomplished using conventional surface mount technology (SMT), i.e. printing the desired pattern of solder paste, placing the components on the solder paste, and attaching the components by reflow soldering. During reflow of the SMT paste and the BGA balls, both substrate 46 and the IC chips 51–54 are attached to printed circuit board 47. This package design is robust, and adds versatility to the assembly operation. It also allows for backside power/ground connection from IC chips 51–54 directly to printed circuit board 47. For assembly, the IC chips may be solder bumped at the wafer level. Then they may be attached first to the printed circuit board 47, and attached to substrate 46 during reflow, or alternatively may be first bump bonded to substrate 46, then attached to printed circuit board 47 during reflow.

The effective pitch of the I/O interconnections, i.e. the spacing between interconnections (pads, runners), on the IC memory chips may be in the range 20–40 $\mu$m. Typical pitch for the wire bonds on the logic chip is 55–70 $\mu$m.

The solder bump configuration used for the chip array on the underside of the substrate may be an area array, i.e. an array of interconnection sites filling the entire chip area. Other arrangements are equally useful. The term area array is generally used to distinguish from edge arrays or perimeter arrays. The solder bump array may comprise any configuration which can be flip-chip bonded. Flip-chip bonding is the attachment of semiconductor IC substrates "upside down" on an interconnection substrate such as a silicon wafer, ceramic substrate, or printed circuit board. The attachment means is typically solder, in the form of balls, pads, or bumps (generically referred to hereinafter as bumps). Solder bumps may be applied to the semiconductor chip, or to the interconnection substrate, or to both. In the bonding operation, the chip is placed in contact with the substrate and the solder is heated to reflow the solder and attach the chip to the substrate. For successful bonding, it is necessary that the sites to which the solder is bonded it wettable by the solder. This is accomplished in practice using a metal coating on the aluminum IC metallization, and applying the solder bump or pad to the coating. The coating is typically referred to as Under Bump Metallization (UBM). The standoff in the embodiments of the invention described above, wherein a solder bumped IC chip is mounted in the BGA gap, includes at least one level of UBM as well as the thickness of the IC chip. A typical UBM is a composite of chromium and copper. Chromium is deposited first, to adhere to the aluminum, and copper is applied over the chromium to provide a solder wettable surface. To insure interface integrity between the solder and the UBM, a composite or alloy layer of chromium and copper is typically used between the chromium and copper layers. A suitable thickness range for the UBM is 7000–15000 Angstroms. A typical height range for the microbumps (e.g. 35 in FIG. 2) is 20–50 μm. Accordingly the thickness of the BGA gap G should be at least the thickness of the IC chip, the microbumps, and the UBM, i.e.:

$$G \geq T+M+U$$

where T is the thickness of the IC chip(s) mounted in the BGA gap, M is the height of the microbumps, and U is the thickness of the UBM layer(s).

As illustrated for example in FIG. 2, the BGA gap dimension G is determined by the height H of the BGA balls 27 and the thickness B of the BGA bond pads 28. Thus:

$$G=H+B$$

and:

$$H+B>T+M+2U$$

where B is the thickness of the BGA bond pads. Typically, but not necessarily, the thickness of the BGA bond pads on the substrate 22 will be the same as the thickness of the BGA bond pads on printed wiring board 26. Thus for simplicity, B here is the combined thickness of the BGA bond pads.

The UBM typically protrudes over the polyimide surface of the IC chip and the BGA bond pads typically stand off from the surface of the printed wiring board, in which events the expression given above is suitable. However, in some structures the bonding sites may be recessed which, as would be evident to those skilled in the art, relaxes the dimensional prescription.

As used herein, the term solder bump pad is intended to refer to a pad that is ball or bump bonded to another substrate and is used to distinguish from a bond pad that is wire bonded. As described above the solder bump pads on the IC chip generally comprise under bump metallization. Typically the wire bond pads on the IC chip are aluminum pads. The wire bond pads on the printed circuit board are typically copper pads plated with nickel and gold, and the wire bonds are typically made with gold wires. The term interconnection pad is used herein as a generic term to describe solder bump pads and wire bond pads.

The term printed wiring board when used herein refers to standard epoxy boards, for example FR4, ball grid array interconnect substrates, and any other suitable interconnect substrate.

Various additional modifications of this invention will occur to those skilled in the art. All deviations from the specific teachings of this specification that basically rely on the principles and their equivalents through which the art has been advanced are properly considered within the scope of the invention as described and claimed.

We claim:
1. An IC BGA package comprising:
   a. a first printed wiring board (first PWB) having an upper surface and a lower surface, a first array of BGA bond pads on the upper surface, and a second array of BGA bond pads on the upper surface, the second array of BGA bond pads spaced from the first array of BGA bond pads, and the BGA bond pads having a thickness $B_1$,
   b. a second printed wiring board (second PWB) having an upper surface and a lower surface, and comprising:
      i. a first array of BGA bond pads with thickness $B_2$ on the lower surface,
      ii. a second array of BGA bond pads with thickness $B_2$ on the lower surface, the second array of BGA bond pads spaced from the first array of BGA bond pads, thereby forming a BGA gap therebetween,
      iii. an IC chip attached to the upper surface of the second PWB,
      iv. an array of IC chip wire bond pads on the IC chip,
      v. a first array of upper surface PWB wire bond pads on the upper surface of the second PWB at least partially surrounding the IC chip,
      vi. a second array of upper surface PWB wire bond pads on the upper surface of the second PWB at least partially surrounding the IC chip,
      vii. a third array of upper surface PWB wire bond pads on the upper surface of the second PWB at least partially surrounding the IC chip,
      viii. an array of solder bump pads on the lower surface of the second PWB, the solder bump pads having a thickness $U_1$,
      ix. a first plurality of wire bonds interconnecting the first array of IC chip wire bond pads and the first array of upper surface PWB bond pads,
      x. a second plurality of wire bonds interconnecting the second array of IC chip wire bond pads and the second array of upper surface PWB bond pads,
      xi. a third plurality of third wire bonds interconnecting the third array of IC chip wire bond pads and the third array of upper surface PWB bond pads,
      xii. a first plurality of BGA interconnection vias through the second PWB,
      xiii. a second plurality of BGA interconnection vias through the second PWB,
      xiv. a plurality of chip interconnection vias through the second PWB,
      xv. first upper surface metallization means for interconnecting the first plurality of BGA interconnection vias and the first array of upper surface PWB wire bond pads,
      xvi. second upper surface metallization means for interconnecting the second plurality of BGA interconnection vias and the second array of upper surface PWB wire bond pads,
      xvii. third upper surface metallization means for interconnecting the chip interconnection vias and the third array of upper surface PWB wire bond pads,
      xviii. first lower surface metallization means for interconnecting the plurality of chip interconnection vias with the solder bump pads,
      xix. at least two IC chips each having a thickness less than T, and each having an array of solder bump pads having a thickness $U_2$,
   c. a first array of BGA solder balls bonding the first array of BGA bond pads on the first PWB to the first array of BGA bond pads on the second PWB, and a second array of BGA solder balls bonding the second array of BGA bond pads on the first PWB to the second array of BGA bond pads on the second PWB, the first array of BGA solder balls and the second array of BGA solder balls having a height H,
   d. an array of solder bumps with height M bonding the array of solder bump pads on the IC chip to the array of solder bump pads on the lower surface of the second PWB, with $U_1$, $U_2$, M, T, $B_1$, $B_2$, and H related by:

$$H+B_1+B_2 \geq T+M+U_1+U_2.$$

2. The IC BGA package of claim 1 wherein the IC chips have been thinned to result in T equal to 15 mils.
3. The IC BGA package of claim 2 wherein the plurality of IC chips in the BGA gap is at least three IC chips.

4. The IC BGA package of claim 3 the number of IC chips in the BGA gap is larger than the number of IC chips on the upper surface.

5. The IC BGA package of claim 4 wherein a single IC chip is attached to the upper surface of the second PWB.

6. The IC BGA package of claim 1 wherein the IC chip on the upper surface of the second PWB is a logic chip.

7. The IC BGA package of claim 6 wherein at least one of the IC chips in the BGA gap is a memory chip.

* * * * *